US008540853B2

(12) United States Patent
Schneider et al.

(10) Patent No.: US 8,540,853 B2
(45) Date of Patent: Sep. 24, 2013

(54) VERTICAL SYSTEM FOR THE PLATING TREATMENT OF A WORK PIECE AND METHOD FOR CONVEYING THE WORK PIECE

(75) Inventors: Reinhard Schneider, Berlin (DE); Uwe Hauf, Wendelstein (DE); Britta Scheller, Altdorf (DE); Henry Kunze, Wendelstein (DE); Ferdinand Wiener, Burgthann (DE); Heinz Klingl, Neausäß (DE)

(73) Assignee: Atotech Deutschland GmbH, Berlin (DE)

( * ) Notice: Subject to any disclaimer, the term of this patent is extended or adjusted under 35 U.S.C. 154(b) by 835 days.

(21) Appl. No.: 12/602,674

(22) PCT Filed: Jun. 3, 2008

(86) PCT No.: PCT/EP2008/004618
§ 371 (c)(1),
(2), (4) Date: Apr. 9, 2010

(87) PCT Pub. No.: WO2008/148580
PCT Pub. Date: Dec. 11, 2008

(65) Prior Publication Data
US 2010/0200410 A1     Aug. 12, 2010

(30) Foreign Application Priority Data
Jun. 6, 2007   (DE) .................. 10 2007 026 634

(51) Int. Cl.
*C25D 17/00* (2006.01)
(52) U.S. Cl.
USPC ........................................ 204/198
(58) Field of Classification Search
USPC .......... 118/198, 407, 423, 500, 503; 204/198
See application file for complete search history.

(56) References Cited

U.S. PATENT DOCUMENTS

| 4,752,371 A | 6/1988 | Kreisel et al. |
| 4,781,813 A | 11/1988 | Archer et al. |

(Continued)

FOREIGN PATENT DOCUMENTS

| DE | 9102321 | 2/1991 |
| DE | 4243252 | 12/1992 |

(Continued)

OTHER PUBLICATIONS

Kanayama, Takuya; Circulation of Treating Liquid and Electrolyte Plating Apparatus Utilizing the Same (both English abstract and Machine Translation); Mar. 5, 1999; JP H11-61498.*

(Continued)

*Primary Examiner* — Luan Van
*Assistant Examiner* — Ho-Sung Chung
(74) *Attorney, Agent, or Firm* — Renner, Otto, Boisselle & Sklar, LLP

(57) ABSTRACT

Vertical system for the plating treatment of a work piece, the system comprising at least two treatment modules, wherein retaining devices for the work pieces are provided in the treatment modules, and at least one transport device including at least one gripping device, which retains the work piece and has a respective fastening device, and each fastening device comprises first and second clamping devices, each associated with one side of the work piece, wherein both the first and second clamping devices are displaceable for gripping and releasing the work pieces, wherein the gripping device comprises at least two fastening devices that are spaced apart from one another, each of the first and second clamping devices are moveable torsion bars as a result of which the work piece is tensioned between the fastening devices during clamping parallel to its first side.

40 Claims, 8 Drawing Sheets

(56) References Cited

U.S. PATENT DOCUMENTS

| | | | |
|---|---|---|---|
| 5,901,997 | A | 5/1999 | Bayer |
| RE37,050 | E | 2/2001 | Hennington |
| 2006/0076241 | A1 | 4/2006 | Schneider et al. |
| 2007/0256923 | A1 | 11/2007 | Schneider |
| 2009/0000111 | A1 | 1/2009 | Schneider |
| 2009/0178900 | A1 | 7/2009 | Scheller et al. |

FOREIGN PATENT DOCUMENTS

| | | | |
|---|---|---|---|
| DE | 10145554 | | 11/2002 |
| EP | 0517349 | | 12/1992 |
| JP | H11-61498 | * | 3/1999 |
| JP | 2004323878 | | 11/2004 |
| WO | WO 2006/000439 A1 | * | 1/2006 |
| WO | 2006015871 | | 2/2006 |

OTHER PUBLICATIONS

Convex definition, Princeton Wordnet, http://wordnetweb.princeton.edu/perl/webwn?s=convex&o2=&o0=1&o8=1&o1=1&o7=&o.*

Official Action for Japanese Patent Application No. 2010-510701 dated Jan. 8, 2013.

PCT/EP2008/004618; PCT International Preliminary Report on Patentability dated Oct. 6, 2009.

* cited by examiner

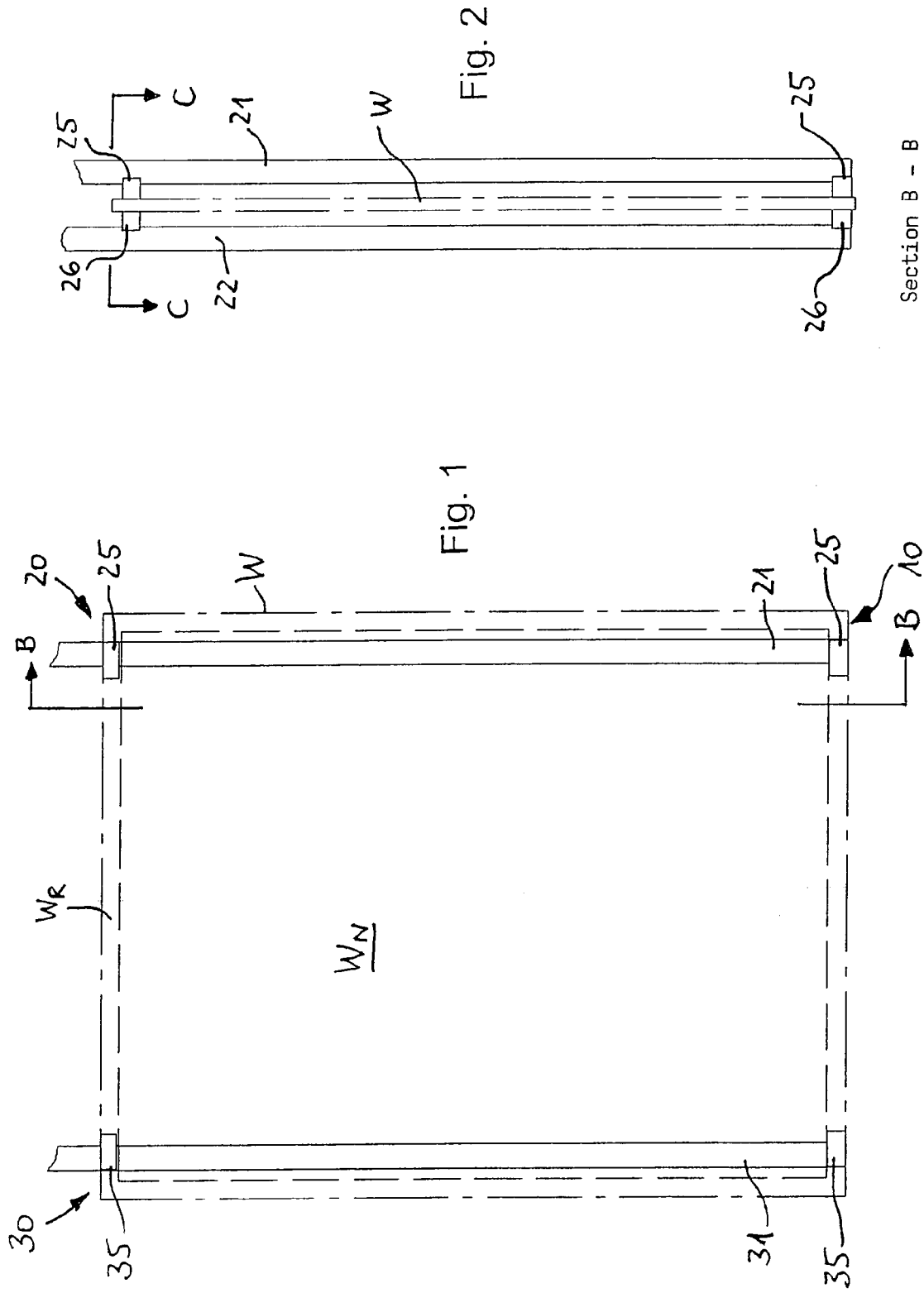

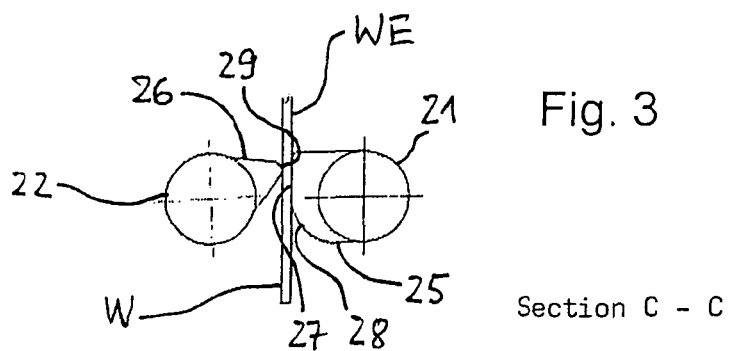
Fig. 3
Section C - C
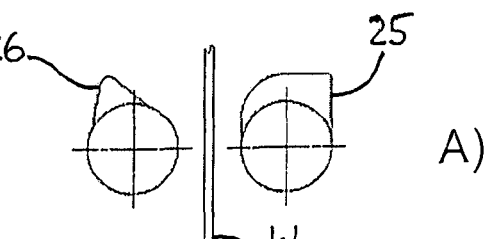
A)
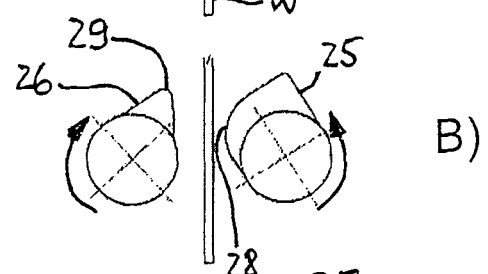
B)
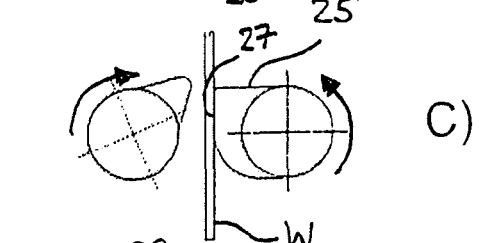
C)
Fig. 4
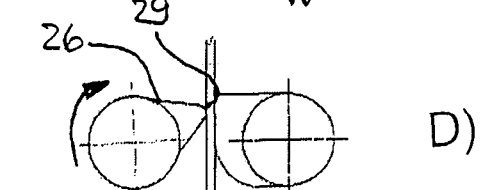
D)
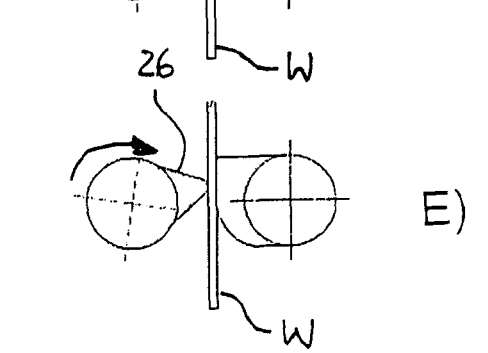
E)

VERTICAL SYSTEM FOR THE PLATING TREATMENT OF A WORK PIECE AND METHOD FOR CONVEYING THE WORK PIECE

FIELD OF THE INVENTION

The present invention relates to a vertical system for the plating treatment of work pieces and to a method for conveying work pieces that are retained in vertical orientation by a gripping device to a treatment module.

Plating systems are used, i.a., for the treatment of printed circuit boards and printed circuit foils and semiconductor wafers as well as in the production of photoelectric cells, such as photoelectric solar cells, and of monitor plates. The treatment in these systems typically comprises chemical and electrochemical treatment methods.

BACKGROUND ART

At the moment chip producers in the semiconductor industry are working on the introduction of so-called 65-nanometer structures (Computertechnik (10), 2007). Even smaller structures of 45 nm are in the process of being developed. However, these dimensions too are only intermediate steps on the road to even smaller structures. Based on the advancing miniaturisation of semiconductor components, new challenges are arising for the manufacturers of printed circuit boards with chip-carriers to adapt their products to new conditions. This means, for example, that current demands for structure dimensions of approx. 25 μm have to be realised if they want to stay in the market. At the same time, it is already clear that in the near future dimensions will get even smaller. It is no longer possible to realise such precision structures with the necessary quality using today's conventional methods and apparatuses in printed circuit board production. In the miniaturisation of structures, structures with irregular contours, even bridges (short-circuits) or interrupts are observed. In addition, it has also been established that the uniformity of the metal layers deposited is insufficient. This is not acceptable as the electric characteristics of the circuits produced in this way will be impaired in an unforeseeable manner, which means that the circuits will have to be rejected.

The aforementioned requirements for the highly precise production of printed circuit boards come with demands to be able to produce these printed circuit boards again and again in very large quantities in as cost-effective manner as possible.

In the past various proposals have been made to achieve the abovementioned objects:

WO 2006/002969 A2, for example, specifies an apparatus for the chemical or electrolytic treatment of material to be treated, the said apparatus comprising treatment containers for the treatment of the material to be treated and a transport system for transporting the material to be treated. The apparatus has a clean room zone that connects to the treatment containers. The material to be treated can be transported through the clean room zone by means of the transport system. The clean room zone is more especially spatially defined by a clean room housing, which includes through-openings and is loaded with excessive pressure through the supply of purified gas. A transport system that comprises a retaining element is used to retain the material to be treated. The retaining element is preferably disposed substantially inside the clean room zone.

WO 2004/022814 A2 also specifies an apparatus for the electrolytic treatment of material to be treated that is at least on the surface thereof electrically conductive, the said apparatus comprising power supply devices for the material to be treated. The power supply devices of the apparatus each comprise contact strips, which contact the material to be treated electrically at side edges that are situated substantially opposite one another. The contact strips can be secured to support frames, and the support frames can be supported by means of support elements in a container, which is to accommodate the treatment fluid. The support elements can be displaceable, which means that the positions of the support frames relative to the support points in the container are variable.

WO 2006/015871 A1 also specifies a container for a vertical plating treatment system for the treatment of work pieces, the said container having a container interior, which is defined by container walls and a container bottom and is formed by at least two container modules. The walls and the bottom of the container in each case define module interior spaces with identical heights and widths. Mounting parts are provided in the containers, such as contact frames, contact clamps, power supply means, movement devices, guide elements for the material to be treated, nozzles, more especially injection nozzles, spray nozzles and surge nozzles, devices introducing air, pumps, heating elements, cooling elements, filters, sensors, dosing devices and devices for chemical treatment. The mounting parts can be retained by support frames and can be lifted together with the support frames in and out of the container. A plurality of containers can be disposed in a matrix-like manner in rows and series.

In addition, WO 2006/000439 A1 specifies a treatment system which comprises at least one row of treatment stations and at least one translatory manipulator. This manipulator comprises at least one driving element, which is drivable along a row of at least two treatment stations, and at least one lifting element and at least one gripping element for the material to be treated, mounted on the lifting element. The lifting elements and the gripping elements are expandable in a modular manner such that the lifting elements, in the expanded case extend transversely relative to at least two rows of treatment stations. Each row of treatment stations is associated with at least one gripping element. The lifting element is formed by at least one lifting unit retained by at least one transverse crossbeam or by at least one transverse crossbeam retained by at least one lifting unit. The transverse crossbeam extends across the rows of treatment stations. The gripping elements are formed by two clamps, which grip the material to be treated, are pivotally mounted by means of respective pivotal points and can be actuated by axial displacement of a respective portion of the clamp.

In addition, DE 195 39 868 C1 describes a transport apparatus for conveying vertically orientated, plate-shaped objects for their chemical or electrolytic surface treatment, the said apparatus comprising a clamp-like lower pick-up region, by means of which these objects can be accommodated and which can be actuated by means of an element that is displaceable substantially vertical between two end positions. The apparatus comprises clamping parts, which are held in a pincer-like manner and have at their lower end contact portions as pick-up regions. The contact portions are actuated via a pivotal connection for detecting and releasing the object by means of a sliding body retained in a clamping suspension. The pivotal connection comprises two articulated arms, one being pivotally mounted on one side at the bottom end of the sliding body and on the other side at the top end of the contact portion. The movement sequence of the sliding body is realised into two consecutive movement sequences of the contact portion, namely into a substantially horizontally extending spreading or clamping movement and a substantially vertically extending raising or lowering movement when transferring from the retaining to the releasing position or vice versa.

An apparatus for the transport of a material to be treated in an electrolysis system is specified in WO 2006/125629 A1. This apparatus is designed in such a manner that the material to be treated is transported along a transport path in a defined transport plane. The apparatus includes a plurality of clamps, which are disposed spaced apart along the transport path so as to be displaceable. The apparatus has a drive to move the clamps along the transport path. The clamps comprise a first clamping face disposed on one side of the transport plane and a second clamping face disposed on the oppositely situated side of the transport plane. The clamping faces are designed in such a manner that both the first clamping face and the second clamping face are displaceable with regard to the transport plane in order to close the clamps for gripping the material to be treated or respectively to open the clamps for releasing the material to be treated. The position of the bottom clamping face adjoining the transport plane can be guaranteed, for example, by means of a stop member.

In addition, DE 91 02 321 U1 relates to an automatic loading apparatus for electroplating printed circuit boards. This apparatus comprises, i.e., a plurality of clamping devices, which are secured to a support frame. The clamping devices comprise clamps, which each comprise a front arm and a rear arm, which are pivotable in a central position. The top end of the rear arm is fixedly connected to a drag-rod. In addition, the clamps are disposed in the support frame, on which pneumatic cylinders are situated, with which the front and rear arms can be pressed. When these cylinders are actuated, they press against the respective top part of the rear or front arm of each clamp, the clamps thereby being opened for gripping or releasing the printed circuit boards.

EP 0 517 349 A1 describes an arrangement for a system for the chemical treatment of printed circuit boards, in which the boards are supplied to a loading station and from there are brought to treatment stations in the system by means of flight bars moved by transport carts and are afterwards returned to an unloading station. The boards are detachably suspended on the respective flight bar by means of clamps and are gripped in this case at an edge area. The clamps each include clamp arms, which are moved into a clamping position by means of a spring. One of the clamping arms is mounted on a flight bar, the other is pivotable about a pivot point in opposition to spring pressure and can be moved from a closed position into an open position by means of a thrust piece.

DE 42 43 252 A1, in addition, specifies an apparatus for retaining printed circuit boards by means of a support frame, which includes a substantially horizontally extending support part, which is provided with spring-loaded clamps, which are provided for retaining and contacting the printed circuit boards electrically at their side edges. The clamps are retained at an upper brace. The clamps comprise a part that is fixed to the brace, wherein the part includes an axis about which a moveable part is pivotable and which is pre-biased by a spring in opposition to the closed position of the clamp.

Finally, EP 0 666 343 A1 specifies an apparatus for the electrolytic deposition of metal on a coatable substrate, the said apparatus comprising, i.e., a clamping device. The substrate can be mounted by its upper edge to a bus bar. The clamping device clamps the bottom edge of the substrate as soon as the bus bar with the substrate is immersed into a container. The clamp comprises at least two lever arms, which are rotatably interconnected by means of a pivot point, the clamp, when floating on the surface of a liquid, is in an open position and when submerged, is in a closed position due to its buoyancy.

The known apparatuses have the disadvantage that the work pieces are not treated precisely enough to be able to produce metal structures again and again in the aforementioned structural sizes. This is the case particularly when the work pieces are thin and foil-like.

OBJECTS OF THE INVENTION

An object of the present invention is to improve the known apparatuses such that the disadvantages of the said apparatuses are avoided and that, more especially, a reproducible treatment of the work pieces is achieved with the aim of forming metal structures on the work piece surfaces in the aforementioned structural sizes. Another object of the present invention is to be able to treat foil-like work pieces also in line with the aforementioned objective. In addition, an object of the present invention is to enable a high degree of cleanliness and a long service life for the treatment baths through less bath entrainment on account of transport conditions. In addition, one further object of the present invention is to be able to produce the work pieces as cost effectively as possible. In addition, it is another object of the present invention to treat the work pieces in an optimum manner. Another object of the invention is to create the optimum treatment conditions for the work pieces at each treatment position and for each treatment step. Yet another object of the invention is to develop the treatment conditions such that as few variations as possible appear with regard to dimensions and time. Yet another object of the present invention is to create treatment conditions that are as reproducible as possible. Yet another object of the present invention is to keep the variations in the treatment conditions between different treatment positions with the identical treatment object as small as possible. Yet another object of the present invention is to obtain a high level of flexibility with regard to the sequence of treatment steps, the adjustability of the treatment parameters and the adaptability of the system size. And it is an object of the present invention to document the treatment conditions individually for each work piece treated.

DESCRIPTION OF THE INVENTION

These objects are achieved through the system for the plating treatment of a work piece in accordance with claim 1 and through the method for conveying a work piece retained in vertical orientation in accordance with claim 27. Preferred specific embodiments of the invention are specified in the sub claims.

As far as the term "vertical system" is used in the description below and in the claims, this refers to a treatment system in which work pieces are able to be treated, the said work pieces being substantially in vertical orientation both during the treatment and during transport from one treatment module to another (i.e., in an orientation in which the work pieces are inclined by a maximum of 20° each relative to the perpendicular).

As far as the term "plating treatment" is used in the description below and in the claims, this refers to a treatment where work pieces are treated by means of liquid or gaseous treatment agents, the work pieces more especially in a process cycle of several plating treatment steps being altered in at least one method step, for example depositing or dissolving a metal layer. The plating treatment can be either a chemical or an electrochemical treatment.

As far as the terms "work piece" and "product" are used in the description below and in the claims, this refers in particular to plate-shaped work pieces, above all to printed circuit boards and printed circuit foils. However, it can also refer to semiconductor wafers, photoelectric cells, such as photoelectric solar cells, as well as monitor plates and glass plates. As far as the work pieces are plate-shaped, they have a work piece plane that extends parallel to the board surfaces. As far as the term "work piece/work pieces" is used in the singular or in the plural, it is to be understood as well in the plural or singular, respectively.

The treatment system according to the invention is preferably designed such that the work pieces are retained in vertical orientation during the treatment in the treatment modules. When being transported from one treatment module to another, the work pieces are preferably also retained in the vertical orientation. Automatic devices can be provided to orientate the work pieces vertically during the loading and unloading processes.

The vertical system according to the invention comprises at least two treatment modules and at least one transport device for conveying at least one work piece to a treatment module and between treatment modules.

Retaining devices are provided in the treatment modules for the work pieces. A work piece is retained by such a retaining device during the treatment. This retaining device is fixed in a stationary manner in the treatment module. The transport device transfers the work piece, after transport to a treatment module, to the retaining devices in the treatment module.

The system according to the invention is characterised in that the boards are preferably directly gripped by the transport device, i.e., they are conveyed during transport without any frame or support frame or flight bar.

The transport device comprises at least one gripping device that retains the work piece and has in each case at least one fastening device, each fastening device including first and second clamping devices, each of which are associated with a side of the work piece. Both the first clamping device and the second clamping device together form a pair of clamping devices and are displaceable for gripping and releasing the work pieces. Consequently, the work pieces are gripped by means of the gripping device with clamping devices opening on both sides and can also be transported in this manner from one treatment module to another treatment module. In general, one gripping device is used to retain and transport one work piece or a plurality of work pieces.

By not only one clamping device but both clamping devices of each fastening device of a gripping device being displaceable, a delicate work piece can be gripped without any problems, without needing to fear that the work piece might collide with one of the clamping devices during the gripping process. This kind of collision can occur especially when a clamping device is fixed and the work piece has to be introduced between the two clamp portions that are in the open position. In this case there is the danger, namely, that the fixed part of the fastening device, e.g., the clamping devices being fixed, scratches along the work piece and, in doing so, damages it.

By a retaining device being provided in a treatment module, the work piece, held in vertical orientation, can be conveyed by means of the gripping device to the treatment module, by
 a) the work piece being conveyed to the treatment module;
 b) the work piece being gripped by the retaining device; and
 c) the work piece being released by the gripping device.

This means that during the transport from one treatment module to another, the work piece can be gripped on the work piece surface at points which lie outside a region to be treated ("useful region"). In addition, the gripping device only comes into contact briefly with the treatment fluid and is not exposed to a current flow during the electrolytic procedure.

At least one first clamping device, associated with a first side of the work piece, is preferably designed and disposed such that the position of the first side of the work piece is defined by the first clamping device. The said first side of the work piece can be a contact plane. At least one second clamping device, associated with a second side of the work piece, contrary to this, is preferably designed and disposed such that a clamping force can be exerted onto the work piece by the said second clamping device.

In a preferred embodiment, the parts of the gripping device that transfer the force are in the form of a tube-in-tube structure, i.e., the two clamping devices are mounted so as to be rotatable in one another. So that no bath fluid penetrates into the interior of the said clamping devices, seals can be provided at the bottom of the tubes preventing this. This means that the gripping device has the advantage of a smaller surface so that it only contributes marginally to bath entrainment.

The first clamping device is preferably designed such that the position of the first side of the work piece is defined by the said first clamping device. This means that the position of the contact side (of the first side) of a work piece is transferred precisely by the gripping device to the retaining device or is taken over by it. The second clamping device, contrary to this, is preferably designed and disposed such that a clamping (closing) force can be exerted onto the work piece by the said second clamping device. Through the different design and disposition and consequently specialising of the two clamping devices it is guaranteed that a precise positioning of the retained work piece is made possible.

In order to be able to fulfil the aforementioned tasks, the gripping device is actuated as follows to grip the work piece:
 i) moving the first clamping device such that the first clamping device takes a contact position and thereby defines the position of the first side of the work piece; and
 ii) moving the second clamping device such that the second clamping device takes a clamping position and, in doing so, the work piece is clamped in position together with the (at least one) first clamping device.

The first clamping device preferably takes over the contact position before the second clamping device reaches the clamping position. Consequently, the first clamping device runs into the end position first and then the second clamping device runs into its end position. However, this does not exclude the two clamping devices also being moved simultaneously at least at times. Indeed the two clamping devices can also be moved one after the other, i.e., at first the first clamping device and then the second clamping device. In the reverse manner when the fastening device is opened, the second clamping device can be moved first into an open position and delayed thereto the first clamping device is moved into the opening position. Using this method of operation to grip a work piece, on the one hand a very precise positioning of the work piece is made possible in a reproducible manner and, on the other hand, the work piece can be gripped without any problem by the fastening device, with no danger of the work piece colliding with the clamping devices. The retaining devices in the treatment modules can be configured, just as the gripping devices, with pairs of clamping devices (first and second clamping devices of the retaining devices), which retain the work pieces. These types of clamping devices at the retaining devices, just as those of the gripping devices, can be in the form of first and second clamping devices, which, as in the case of the clamping devices on the gripping devices, serve to define the position of the first side of the work piece or respectively to apply a clamping force onto the work piece and are displaceable for this purpose. The clamping devices of the retaining devices can preferably have the same features as the clamping devices of the gripping devices, therefore, for instance, being rotatable and, where applicable, just as the clamping devices of the gripping devices, including corresponding clamping faces. The retaining devices can be actuated, for example, by means of pneumatic drives.

In another preferred specific embodiment of the invention, the gripping device includes at least two fastening devices that are spaced apart, which respectively hold a work piece at opposite edges, the respective first and second clamping devices of the fastening devices are displaceable such that the work piece is tensioned (between the fastening devices) during clamping parallel to its first side in order to avoid a bending or arching of the board. For example, on a rectangular work piece being retained in a vertical orientation, such tensioning may be carried out in a substantially horizontal direction if the fastening devices are arranged at the opposing vertical edges of the work piece or may be carried out in a substantially vertical direction if the fastening devices are arranged at the opposing horizontal edges of the work piece.

In another preferred specific embodiment of the invention, the at least two fastening devices are designed and disposed such that they grip the work piece in regions outside the "useful" area, for example in the edge region, preferably at the bottom and top edge or at the side edges, and during clamping, exert tension forces, directed in opposite directions towards each other, onto the work piece respectively in the board plane. The work piece W has a contact side (first side) WE in FIG. 1A.

Plate-shaped work pieces can be gripped in this manner more especially at oppositely situated edges with the at least two fastening devices that are spaced apart. The clamping devices are preferably moved such that when clamping the work piece, in addition to the clamping force (working vertically onto the work piece surface), a tension force, directed parallel to the work piece surface outwards (in the direction of the work piece's edges), is exerted. In order to apply this tension force, another method step can be carried out, namely:

(iii) moving at least one of the first and second clamping devices, more specifically moving the second clamping device without moving the first clamping device such that a tension force is applied onto the work piece parallel to the first side of the work piece.

It is also possible for the tensioning procedure to take place at the same time as the clamping procedure. A movement sequence that is very simple to be carried out includes this third method step which is carried out afterwards, the said step being achieved in that, after the applying the clamping force onto the work piece by moving the second clamping device, the clamping devices continue to be moved such that an additional force directed parallel to the work piece surface is applied to the work piece.

For example, to tension foils after clamping, the second clamping device can be rotated further so that a corresponding force is applied to the foil edges via friction. The rotational movement should be effected in the direction in which the forces pull the foils apart. The forces and movements for tensioning can be the same size on both sides of the board, or the foil is only tensioned on one side.

If work pieces with very different thicknesses are to be transported in the system, the gripping device can be provided in each case with resilient elements for the second clamping device. The spring travel, in this case, is provided in the direction towards the work piece or respectively away from the said work piece. The said aforementioned specific embodiments preferably serve to retain foil-like work pieces in a reproducible manner and to secure them in the board plane in order to be able to treat each region of the product uniformly. By the work pieces being tensioned during clamping, their position is fixed in a precise manner, and they can be transported and transferred in a precise position to a retaining device in a treatment station. An additional achievement is that the spacings between board and mounting parts, such as the flow device, are identical over the entire surface, thus enabling a uniform treatment of each surface element. Even when the product is moved, each region of the product is moved by the identical path.

The work piece can also be retained on one side with a first (larger) force and only its other side pulled outwards with a second force that is smaller than the first force.

It is especially favourable when the movements of the first and the second clamping devices are rotational movements. For example, the first clamping device of a pair of clamping devices in a fastening device in a particularly preferred specific embodiment of the invention can be rotatable about a first axis of rotation and the second clamping device of the pair of clamping devices in the fastening device about a second axis of rotation that is parallel to the first axis of rotation. This makes it possible to design the apparatus in a very compact manner. In addition, the closing force onto the work piece can be adjusted by means of the rotational position in a gentle and precise manner. Finally, this development also enables foil-like work pieces to be easily gripped and tensioned.

The position of the first side of the work piece can be defined particularly precisely by means of a rotational position of the first clamping device. In order to define the position of the work piece by rotating the first clamping device, a first portion of the outer boundary of a section of the first clamping device created at right angles to the first axis of rotation can be convexly curved in a particularly preferred specific embodiment of the invention and a second portion of the outer boundary of the section can be formed by a straight boundary line that connects tangentially to the first portion of the outer boundary. Consequently, the first portion can be formed as a type of cam disc. By the second portion being suitable to be applied flush to the work piece, the position of the work piece can be defined in a precise manner. The first portion serves to gently guide the work piece when the second portion approaches. The axis of rotation of the first clamping device, in this specific embodiment, can preferably be placed such that the outer boundary during rotation approaches the work piece surface until the straight second portion abuts in a flush manner against the work piece surface.

In an exceptionally preferred specific embodiment of the invention, the first portion is formed by a convex surface segment that is parallel to the first axis of rotation and the second portion is formed by a preferably flat contact face that is configured abutting against the first side of the work piece. This means that the first clamping device abuts smoothly against the work piece surface in the closed position; thereby avoiding a tipping movement of the work piece at the clamping point. When the work piece is gripped, the first clamping device, in this case in method step i), can be rotated until the flat surface portion has reached the abutting position.

The second clamping device preferably has a convex clamping face, configured for transferring a clamping force onto the second side of the work piece. The second clamping device preferably comprises a convex clamping face that is designed to transfer a clamping force to the second side of the work piece. For this to occur, the second clamping face is disposed at a distance to the second axis of rotation that equals or is larger than the distance between the second axis of rotation and the surface of the work piece to which this clamping shall abut. This second clamping face is preferably designed to be parallel to the second axis of rotation.

For a compact embodiment, the fastening device includes a first torsion bar, which retains at least one first clamping device and is coaxial relative to the first axis of rotation, and a second torsion bar, which retains at least one second clamping device and is coaxial relative to the second axis of rotation. The torsion bars can be formed from solid material or by tubes.

So that a plate-shaped work piece can be retained in a sturdy manner, preferably at least two pairs of clamping devices, each made up of first and second clamping devices, can be retained at a torsion bar pair that comprises the first and the second torsion bar and which form a fastening device. These clamping device pairs can be disposed preferably spaced apart at the respective fastening devices in order, for example, to be able to retain a work piece, or at other points spaced apart as far from each other as possible so that the work piece is retained with no possibility of tipping over. Thus, when the work piece is lowered into a bath in the treatment module, it is not possible for the board to deflect. If a clamp has several pairs of clamping devices, care must be taken with the design to ensure that all clamping devices are able to grip with sufficient clamping force. Between an upper and a lower pair of clamping devices on one fastening device additional clamping device pairs can be provided, which then grip the edges of the board at the side.

In another specific embodiment of the invention, the work pieces can also be retained exclusively at their upper edge by the gripping device. In this case, the work piece is only gripped with a few clamping devices, i.e., via few contact points, preferably via only two contact points, via which the clamping devices contact the work piece. As the fastening device in such a case is only immersed a little into the bath, fluid is hardly entrained out of the treatment module.

In a preferred specific embodiment the gripping devices are made from corrosion-resistant material such as stainless steel or titanium.

The gripping devices grip the product directly, i.e., without using additional frames or racks to retain the product during transport or during treatment. Thus a high level of cleanliness and long service lives of the treatment baths are possible because there is a small amount of the transport-related bath drag-out. Contamination of the boards by fluid adhering to the frame is also avoided in this way.

The retaining force is generated by means of a spring mechanism. Thus it is ensured that the product continues to remain gripped even if there is a power failure. The opening force at the fastening devices, contrary to this, is generated via an actuating drive, such as a pneumatic cylinder or motor.

The gripping device used in the system according to the invention serves to transport a work piece into a treatment module for the treatment. According to the invention, the work piece is transferred in the treatment module to a retaining device, which is disposed in the module. To this end, the gripping device can release the work piece once the work piece has been transferred to the retaining device gripping the work piece. Afterwards it can be moved out of the module again. After the gripping device has deposited a first work piece in the module it is available for the transport of another work piece. Consequently, during the treatment process, in this case, the gripping device is not situated in the treatment module. Consequently the gripping device retaining a work piece can be moved into a treatment module in order to deposit and release the work piece there, the work piece being taken over by the retaining device disposed in the module. The gripping device is then moved out of the treatment module.

In a corresponding manner the gripping device can be moved into a treatment module before method step i) to take over a work piece having been treated in a treatment module in order to grip the work piece there. To this end, the retaining device being disposed there releases the work piece. Once the work piece has been gripped, the gripping device together with the work piece is moved out of the treatment module.

In order not to damage a work piece situated in a treatment module when moving the gripping device in or out, the first and second clamping devices are to be opened from their gripping position, either simultaneously or with a time delay.

For the transfer of the work pieces from the gripping device to the retaining device in the bath container or vice versa, the position of the work pieces must not be changed, because otherwise it will be necessary to re-align the work pieces in the bath container. In particular in the case of very thin and light printed circuit foils a minimum of two fastening devices are provided per work piece. In this case, the transfer of the work pieces from the transport device to the retaining device takes place in the bath container, preferably in two steps: In a first step the first clamping devices of the gripping device are opened, whilst the clamping devices of the associated retaining device in the bath are still open. The second clamping devices of the gripping device still remain in the original position such that the work piece then is still abutting only against the second clamping devices. Then the first clamping devices of the retaining device in the bath close. In a second step, the second clamping devices of the gripping device are opened and the second clamping devices of the retaining device in the bath are then closed.

This method of operation prevents the conducting foils being damaged by the transfer procedure without the position of the work pieces being changed. With an offset of the displaceable clamping devices at the transport system relative to the fixed clamping devices at the retaining device in the bath, if both the clamping devices of the gripping device and those of the retaining device were closed at the same time on one side of the board, the work pieces would be damaged through overexpansion of the material when being gripped by the retaining device.

In addition, the gripping device can also be designed such that with the said gripping device an electric contact to a retained work piece is produced, which means that a polarisation current is transferred to the product moved into a treatment module or moved out of a treatment module.

The system according to the invention preferably includes rinsing devices (preferably water spraying devices), with which the at least one gripping device and/or the work pieces can be rinsed when being removed from the treatment module (for example hosed down). The rinsing devices are disposed above the level of the bath and are operational when the gripping device, with or without work piece, is moved past a rinsing device, for example an injection tube, when being lifted out. Consequently, the clamping devices can be cleaned when the gripping device moves past the rinsing devices. Consequently, it is possible, in particular, to rinse regions on the clamping devices via which the clamping devices contact the work pieces. A rinsing device can be operated in particular also when the gripping device at that location is not retaining any work pieces, i.e., in particular when the gripping device is moved out of the treatment module after having deposited the work piece. As an alternative, the gripping devices can be rinsed also by means of rinsing devices provided on the transport device, for example by means of injection tubes mounted at that location, for example during the travel from one treatment module to another. The transport system can be provided with an automated drip pan in order to avoid drag-out.

A retaining device in a treatment module can be designed such that the position of a work piece retained thereby in the treatment module can be adjusted, more especially centred, in one or more directions parallel to the work piece plane or also at right angles relative thereto. Positioning means are provided in the treatment module for this purpose, thereby guaranteeing an optimum position of the product during treatment. The positioning devices are preferably situated in the bath region and can align the board parallel to the board surface, for example the vertical alignment can be set via a stop member and the transverse alignment via eccentrically mounted discs or a lever mechanism.

In order to recognise in good time whether boards are suspended inclinedly relative to the gripping device, the transport system can be provided with a sensor system. This monitors the position of the board at least two points. Photosensitive sensors, for example, are suitable.

The individual treatment modules are preferably equipped for self-sufficient operation, i.e., each treatment module has all the devices necessary for the treatment of the product, for example its own container, own flow members, devices to move the product, pumps, devices for filtering, cooling, heating and dosing etc. Each treatment module can therefore be operated independently of the others. This makes it possible to stop any mutual interference between treatment modules and work pieces in these treatment modules, for example through heat transference via common container walls, by fluid exchange, exhaust air mixing, dissimilar power supplies etc. This means the treatment parameters are controllable and measurable in a very precise manner and results in considerably better and particularly uniform treatment results.

In principle, the system can be provided such that a few types of treatment modules are used. Each module type has a selection of mounting and attachment parts with regard to number and design (bath circulation, heating, cooling, incident flow devices, etc.), which are then installed depending on the procedural requirement in the treatment module. Consequently there is maximum equipment from which parts are selected to equip the treatment module. This means that mounting and attachment parts in different treatment modules of one module type are designed identically and disposed at the identical position. This reduces the cost and effort spent on design and production. The procedural, treatment-relevant performance of the mounting and attachment parts is also identical in each treatment module in which they are installed. This means that deviations in the performance data of treatment modules that are identically equipped and consequently also the treatment results of the work pieces treated in the said treatment modules are minimised. But also performances and consequently treatment results from the differently equipped treatment modules are thus comparable.

The system according to the invention can be designed such that at least one treatment module comprises the following structural features:
 a. a container for accommodating treatment fluid;
 b. a basic frame with an accommodating frame retaining the container;
 c. mounting parts, that is to say parts that are situated in the interior of the container up to the cover, such as, for example, heating, cooling;
 d. a support frame for mounting parts that are to be moved at right angles to the work piece plane;
 e. an oscillation frame for mounting parts that are to be moved parallel to the work piece plane;
 f. attachment parts, that is to say parts that are situated outside the inside region of the container, such as pumps, filters; and
 g. covers for the container.

By the container being supported by an accommodating frame and at the same time being fixedly or detachably connected to the said frame, it does not need to take on any static function itself. It is installed with so much play, for example suspended in the accommodating frame, that its thermal expansion is not transferred onto the accommodating frame or the framework. For example, a container with a flanged edge can be suspended in the accommodating frame, which is retained by a basic frame. Each of the treatment modules can be secured thereby on the floor, on the ceiling or on another securing face. Each module can have its own basic frame or there can be a common basic frame with other modules. A basic frame of this type can also be expandable. The basic frame is preferably made from metal so as to eliminate largely temperature influences. The basic frame can stand on the floor or can be secured to the wall or to the ceiling. Attachment and mounting parts, which are components of a treatment module, are not secured to the container itself. This, in turn, enables a sufficient thermal expansion of the container during operation without any change to the positioning of the said components. Consequently, the spatial layout of the individual components in the treatment modules one relative to another is considerably more precise and more easily reproducible than if the container had had to take on a supporting function itself. As the thermal expansion of the container for the aforementioned reasons has no effect on the positioning of the individual components in the treatment module, its design can be simple and the container does not require reinforcing, which means that the production costs of the container can be considerably reduced compared to conventional structures.

The containers, in addition, are preferably configured without a dead zone with regard to bath flow, i.e., they have rounded corners. The container cross-section can be bigger at the top than at the bottom to make it easier to change over mounting parts. The containers are preferably made of plastics material. In order to achieve a cost-efficient production, it is advantageous for the containers to be produced using cost-effective methods of mass production, such as centrifugal moulding, rotational moulding or container blowing. The containers can be made of metal or plastics material.

The support frame is preferably secured to the accommodating frame. In an additional specific embodiment the support frame is retained by the accommodating frame so as to be displaceable. This means that the support frame can retain container mounting parts, which are displaced relative to the container and at right angles to the product, such as, for example, the retaining device and flow members and electrodes. The support frame is preferably moved by means of a pneumatic drive. Through the defined end positions of a pneumatic drive, the support frame can take over defined positions in the treatment module. This enables, in a reproducible manner, a precise transfer of the product between gripping device and retaining device. These types of pneumatic drives can also be used for other devices in a treatment module if the said devices have to take over defined positions.

Irrespective of the displaceability of the support frame, its precise positioning in the treatment module is important as mounting parts mounted thereon and the product have to be positioned precisely relative to the gripping device. Consequently, the support frame or its guide, in one specific embodiment of the invention, is adjustable at least one point in at least one direction, preferably vertically and laterally.

The support frame is preferably made of metal in order to largely eliminate temperature influences.

The oscillation frame can be secured to the support frame so as to be displaceable. Components, which can be moved parallel to the board surface, such as, for example, flow members or anodes, are secured to the oscillation frame. In one preferred embodiment, the oscillation frame can comprise a boom, which can serve both to guide the oscillation frame on the support frame and also as a tube of spray tubes. The achievement of this arrangement is that components, especially flow members and anodes, which are to be moved parallel to the product, are always at a constant spacing from the product even if the product is moved at the same time at right angles to its surface. This enables optimum uniform treatment of the product.

Flow devices are preferably provided in each treatment module.

In order to keep the solution volume in the treatment module and the space required of the module as low as possible, the treatment modules are preferably designed as compactly as possible. For example, a ratio between the liquid volume and the board blank of less that 8 $l/dm^2$ in modules that operate chemically and electrolessly and less than 15 $l/dm^2$ in galvanic modules can be achieved, the corresponding dimensions of the container being hardly any greater than those of the work piece.

In order to achieve as cost-effective a maintenance procedure as possible for the individual treatment modules, the support frames on which the moved mounting parts are retained can be designed to be removable from the module. This also allows for easy adaptation of the treatment stations to different treatment tasks.

On account of the comparably light weight and the compactness of the treatment modules and on account of the use of identical connections to supply the modules with secondary power and for removal and on account of the identical space requirement in each case, complete treatment modules can be exchanged in simple manner. It is also comparatively simple to upgrade the system. Prefabricated treatment modules are placed, aligned and connected at the corresponding positions of the treatment stations and the transport device is adjusted.

Supply devices, for example for compressed air and water, can preferably be secured to the basic frame. They are situated at the identical position in each treatment module of the same type. Consequently, it is simple to prepare the site for the treatment module.

In a particularly preferred specific embodiment of the invention, at least one treatment module in the system is designed to accommodate and treat just one work piece, i.e., at any time in the treatment module there is only one work piece. A module can also be designed to accommodate several work pieces disposed one adjacent the other in the module. In this case, the work pieces can preferably be situated in compartments separated from each other in the treatment module. However, processing an individual work piece in a module is preferred and achieves highly reproducible, accomplishable treatment of the work pieces. The treatment conditions for each work piece can be adjusted very precisely independent of those of other work pieces.

For the treatment of the work pieces, the treatment modules can be disposed in module sequences such that the work pieces can be treated one after the other in the module sequences, by the work pieces being moved into the individual modules one after the other. A plurality of these types of sequences of treatment modules can be disposed next to one another such that a matrix of sequences and rows of treatment modules is produced. Consequently, a plurality of treatment modules, in which the same treatment step is being carried out, can be arranged next to each other in order to be able to treat a plurality of work pieces at the same time. The matrix can also include modules, which enable operating modes that are alternative to the treatment in one treatment row, e.g., modules with deviating procedural parameters. A system of this type can be adapted to the space available in an optimum manner. If individual containers are used, adjacent containers preferably being spaced apart, a mutual influencing of adjacent containers, for example through thermal transfer, cannot take place. Separate containers can be interconnected, however, by pipe lines (bypass lines), which are preferably blockable. This can achieve that the interconnected containers have the same bath fluid with regard to concentration and temperature.

The control of the transport device can be designed more especially so that capacity utilisation is as optimum as possible.

The modules in the matrix-like arrangement can also be provided in such a manner for the individual treatment stations that a work piece for treatment with a predetermined treatment sequence is not moved into treatment modules within a row or sequence of the module matrix, but is moved into a sequence that deviates therefrom. Consequently, the transport device, where the modules are arranged in the matrix shape, can be designed more especially so that a gripping device is conveyed from one treatment module to any other module (by using so-called coordinate transport carts), i.e., the transport device can extend to all rows of treatment modules such that the gripping device supplies work pieces to treatment stations in different rows or conveys work pieces one after the other to different modules within one row. This also achieves the greatest possible flexibility and capacity utilisation for the transport device as well as adaptability of the system to space and production requirements.

The boards are transported preferably in the method direction which means that the material is transported in an optimum manner. However, freely configurable treatment sequences are also possible, such as, for example the repetition of a process step. This enables maximum freedom when treating the boards.

A vertical system is characterised by a main transport direction, which is produced by the path traveled by the transport cart, hereafter also referred to as the x-axis. The y-axis extends at right angles thereto and in the horizontal. At right angles to these two axes, the height of the individual treatment modules is described by means of the z-axis.

A treatment module includes, apart from the vertical extension corresponding to the board extension in the module, in each case oppositely situated longitudinal sides and end faces, the end faces being narrower than the longitudinal sides.

The treatment modules, in a preferred specific embodiment of the present invention, are disposed such that the respective longitudinal sides extend in the direction of transport. This means that many treatment modules can be placed adjacent each other and consequently many work pieces can be treated simultaneously in a respective one of these treatment modules without the transport device having to have an excessive width to span over all the treatment modules in a row. Consequently the treatment modules in this specific embodiment are placed such that their longitudinal sides extend parallel to the x-axis. In principle, there are then two different treatment sequences:

Treatment sequence 1: Modules for different treatments are disposed along the y- and the x-direction. Consequently it is possible for the product for treatment to be transported through the system by the gripping device both in the y- and in the x-direction. That can be, for example, a meander-shaped sequence of treatment positions. This sequence is advantageous for systems with small throughput.

Treatment sequence 2: Modules with the same treatment task are disposed in the y-direction and those with different tasks in the x-direction. The treatment sequence would then only take place in the x-direction. This design is provided to make the x-dimension of the transport cart as short as possible with a given number of boards.

Of course, it is also possible to align the longitudinal sides in the y-direction for both treatment sequences.

Also preferred is having every two treatment modules disposed adjoining each other (directly next to one another) via the end faces. Consequently, it is possible to accommodate the components associated with each treatment module so that they are accessible for maintenance, as a maintenance corridor can be provided between each of the pairs of treatment modules. The components can preferably be disposed at the respective other end face of the module. This enables space to be saved, on the one hand, and good accessibility, on the other.

As each piece of equipment used (mounting part, attachment part) is associated with only one treatment module and one work piece (during its treatment in the module), it is possible at any time, by evaluating the actual supply current for the work piece, the flow conditions in the container, the temperature, the bath composition etc. to draw out information on the production conditions for a certain work piece and on its treatment data. This means that indirect measurements (for several work pieces) with sensors, otherwise necessary for the documentation of the treatment data, can be dispensed with.

The treatment module, in addition, can include connections for the power supply, such as air injection, connections for water supply and exhaust, each with their own sensor systems to detect the respective output. In addition, sensor systems and control systems for the temperature, fluid levels and the flow conditions can be provided depending on the specific purpose of the treatment module. This means that the treatment parameters for each treatment process can be recorded, documented and associated with the treated work piece.

The treatment modules of the vertical system according to the invention in another preferred arrangement can be provided with covers, preferably with automatically actuated covers. These types of covers can be in the form of sliding doors for the work pieces that are to be lowered into a treatment module.

The treatment modules can also be provided with exhaust devices. In addition, in a preferred specific embodiment of the invention, there is an exhaust device on the transport device, in particular when the transport device also moves towards treatment modules in which a treatment is being carried out at a temperature that is clearly above room temperature. The transport device, in this case, is preferably equipped with a housing that surrounds the device. The corresponding outlet air line of the exhaust device can be provided with corresponding exhaust connectors such that the extracted air is sucked out of the transport device. The connectors can be provided with suitable valves.

The system can be designed using clean room technology. A so-called flow box can be provided here, i.e., a box through which the purified (filtered) air flows in a laminar manner. This flow box can be disposed so as to be either stationary above the treatment modules such that the transport device moves in this flow box, or the flow box simply surrounds the transport device and is moved together with the said transport device. To generate the clean room conditions in the flow box, a device can be provided, for example, which is entrained with the transport device above the transported work piece and which outputs clean room air downwards, flowing around the work piece. Just moving a work piece into a treatment module causes a cover mounted on the container to be opened so as to avoid contaminants passing into the treatment liquid. Once the work piece has been moved in or out, the cover is closed again.

So that the laminar air flow from the flow boxes remains as laminar as possible along the product, the shape of the transport system is coordinated with it. The gripping device is designed such that as few disturbances as possible occur, and consequently is encased, for example, in a manner favourable to the flow, for example, in a drop-shaped manner. The cross-beam, to which the gripping device is secured, is round, for example with a circular cross-section.

The transport device can include an absolute measuring system, which enables the transport device to be correctly positioned in the three (orthogonal) directions of movement of the device. To this end, for example, an electromechanical centering system is used for each treatment module. The individual positions are approached at the system launch until they are precisely reached, and the positional values obtained at this time are then stored in the system control such that they are automatically approached in a precise manner in the future. An automatically controlled re-adjustment is effected at certain time intervals.

Each treatment module can have its own automatic system monitoring the parameters of the treatment liquid, i.e., an automatic measuring system, preferably on line, measuring the concentrations of substances in the fluid, and in addition an automatic dosing means for these substances. In addition, documenting means associated with the treatment modules can be provided, with which documenting means production-relevant data for each work piece can be individually collected, associated with the corresponding work piece and then documented in a report.

In the system according to the invention, each board can be treated with an individual treatment program, as it is necessary to be able to treat boards, which require a very wide spectrum of different treatment parameters in order, for example to be able to treat blind vias, bore holes with high aspect ratios, surfaces with a particularly small deviation in the distribution of the layer thickness, base material with badly conductive coatings, etc., in a particularly optimum manner. The variables to be optimised in each case can be, for example: bath composition, treatment time, incident flow, electric current parameters, temperature, method sequence etc.

In order to achieve optimum treatment results, the work pieces can be aligned in a couple of treatment modules in the x-direction, i.e., in a main transport direction, and/or in y-direction, i.e., transversely relative to the transport direction, and/or in z-direction, i.e., in a lift/lower direction. This can take place in the system itself, for example, in a treatment module. Or it must be ensured that after a one-off alignment of the board before being moved into the system, the board guide means on the transport device and inside the treatment module functions so precisely that an admissible tolerance is not exceeded.

DESCRIPTION OF THE DRAWINGS

The Figures described below are to explain the invention in more detail:

FIG. 1: is a side view of a preferred specific embodiment of a gripping device;

FIG. 2: is a section along B-B in FIG. 1;

FIG. 3: is a section along C-C in FIG. 2;

FIG. 4: is a section along C-C through the gripping device shown in FIG. 2 in different gripping stages;

Identical reference numerals refer to the same elements in all the Figures.

FIG. 1 shows a preferred specific embodiment of a gripping device 10 in accordance with the present invention. A work piece W is gripped by the gripping device 10. This is a plate-shaped work piece, for example a printed circuit foil. The work piece W, according to FIG. 1A, has a contact side (first side) WE. It includes an inner useful region $W_N$ which is separated from an outer edge region $W_R$ by the dashed line. The gripping device 10 includes a first fastening device 20 and a second fastening device 30. These fastening devices 20, 30 each comprise first torsion bars 21, 31 and second torsion bars 22 (FIG. 2). The second torsion bars cannot be seen in FIG. 1 as they are covered by the work piece W. The first torsion bars 21, 31 and the second torsion bars 22 extend further upwards and are retained in a mounting, which is not shown, but also forms part of the gripping device 10.

Figure 11:
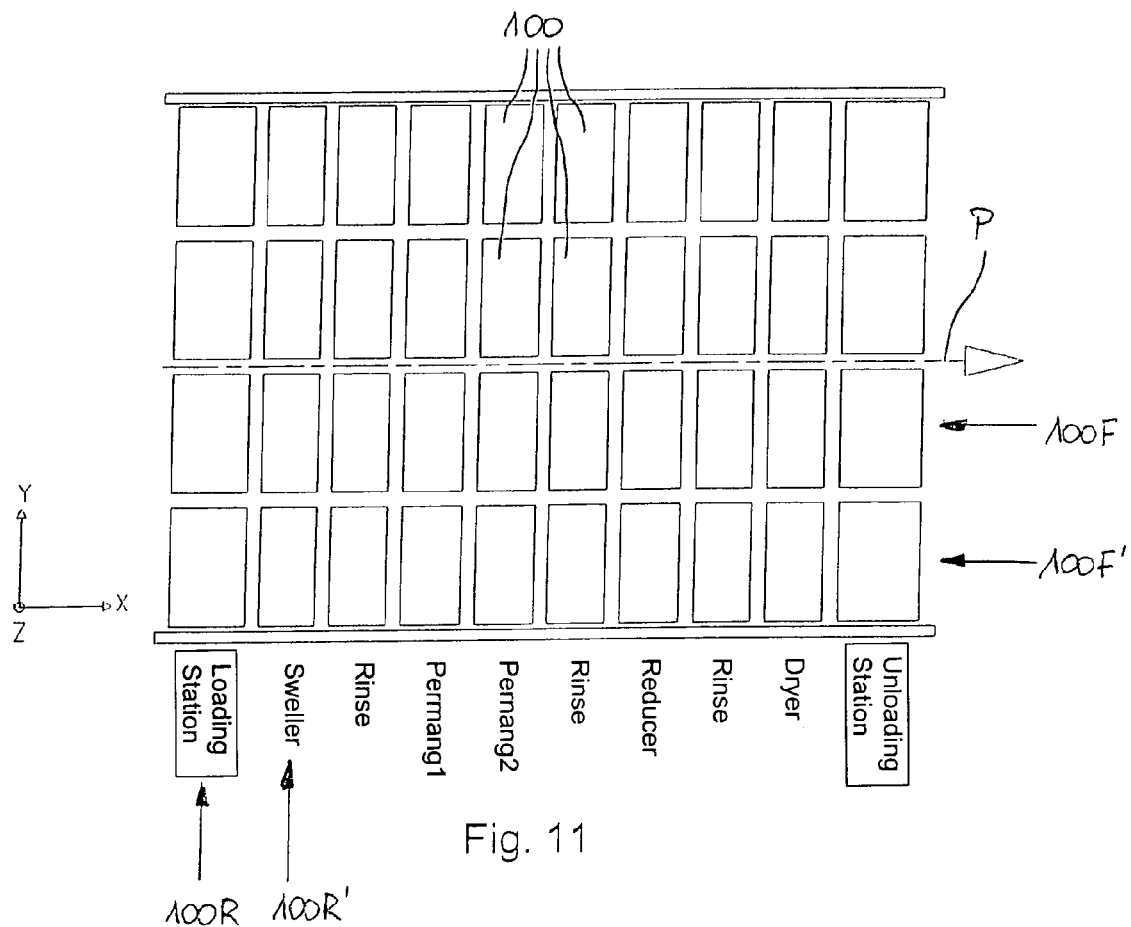
FIG. 11: is a schematic representation of the arrangement of treatment modules in a third specific embodiment.

First clamping devices 25, 35, which together with second clamping devices (not shown) clamp the work piece W, are supported on the first torsion bars 21, 31.

The first torsion bars 21, 31 and the second torsion bars 22 of the gripping device 10 and the first clamping device 25, 35 and second clamping device 26 (FIG. 2) are preferably made from stainless steel.

Figure 1A:
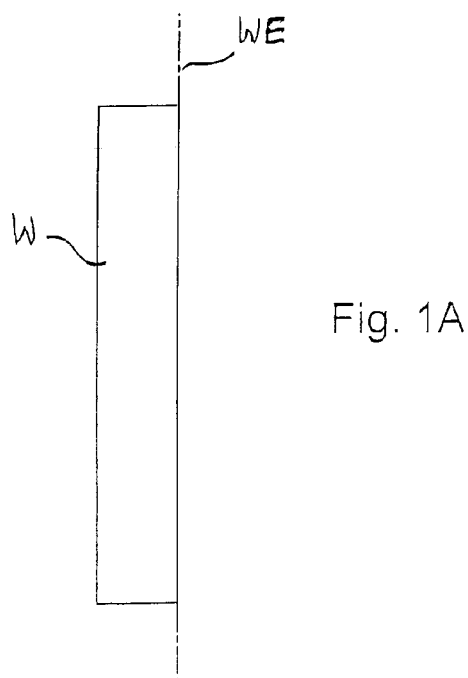
FIG. 1A: is a schematic section through a plate-shaped work piece.

FIG. 2 shows a section along B-B in FIG. 1. A first torsion bar 21 (about first axis of rotation 201) and a second torsion bar 22 (about second axis of rotation 202) support the respective first clamping devices 25 and second clamping devices 26. The work piece W is shown clamped between these clamping devices 25, 26.

FIG. 3 shows a section along C-C in FIG. 2. The first clamping device 25 sits on the first torsion bar 21 (about first axis of rotation 201) and the second clamping device 26 sits on the second torsion bar 22 (about second axis of rotation 202). The work piece W, for example a conductor foil, is clamped between the two clamping devices. In the representation in FIG. 3 (just as in the representations in FIG. 1 and FIG. 2), the work piece W is shown already completely clamped. The first clamping device 25 and the second clamping device 26 are moved into the closed position by means of a rotation of the first torsion bar 21 (about first axis of rotation 201) or respectively the second torsion bar 22 (about second axis of rotation 202). In this closed position, the contact face 27, which is planar in the example shown, abuts flatly against the surface of the work piece W. This surface is formed by the contact plane WE on the work piece. The clamping face 29 of the second clamping device 26 also abuts against the work piece and exerts a clamping force onto the work piece W. A convex surface segment of the first clamping device 25 is identified by the reference 28.

The time sequence of the gripping procedure is shown in FIG. 4 in five different stages. The view corresponds to that in FIG. 3. In a first position, in which the work piece W is not yet gripped (start position A), neither of the two clamping devices 25, 26 abut against the surfaces of the work piece W. By rotating the first clamping means 25 anticlockwise, the convex surface segment 28 approaches the first surface of the work piece W. At the same time in the example shown, the second clamping device 26 rotates clockwise. In a third rotational position (C), the contact face 27 of the first clamping device 25 abuts against the first surface of the work piece W, as this device 25 has been rotated further anticlockwise. The clamping face 29 of the second clamping device 26 does not yet abut against the second surface of the work piece W, although this clamping device 26 has also been rotated further, albeit clockwise. In the rotational position (D), the clamping face 29 now also abuts against the second surface of the work piece W and exerts a clamping force onto the work piece W. If the second clamping device 26 were rotated further out of this rotational position by applying an increased rotational force (clockwise; see arrow), the work piece W could be tensioned (rotational position E).

To describe the vertical system according to the invention in more detail, reference is made to the following Figures, which reproduce the individual components of the system in a schematic manner.

Figure 5:
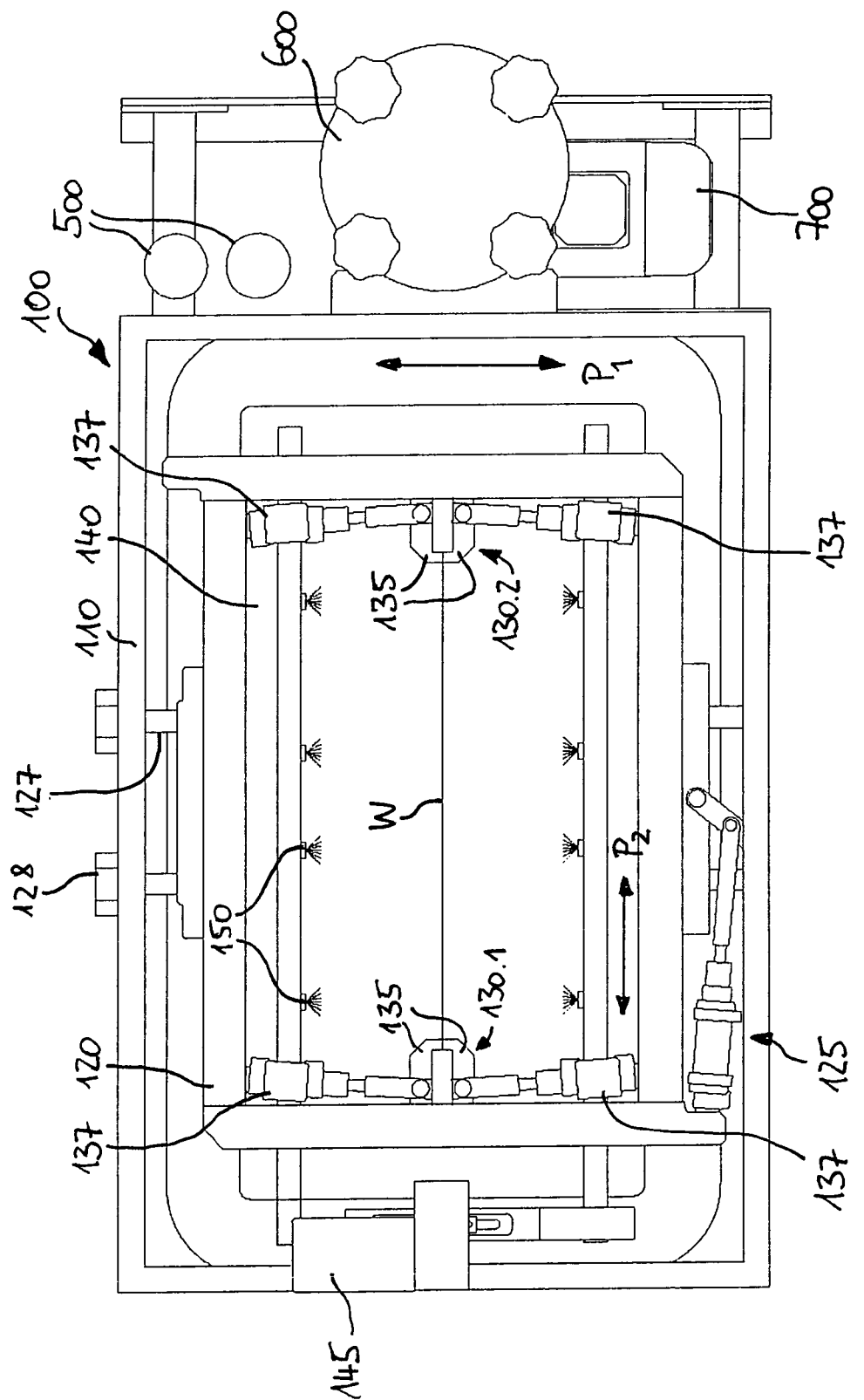
FIG. 5: is a schematic top view of a treatment module of a vertical system according to the invention.

FIG. 5 shows a schematic top view of a treatment module 100 of a vertical system:

The treatment module 100 includes an accommodating frame 110. The said accommodating frame 110 is a component of a basic frame 105, which is shown in more detail in FIG. 6. The accommodating frame 110 serves to retain the container (not shown in any more detail in FIG. 5), in which treatment liquid is contained and in which a plating treatment takes place. It is made, for example, from sturdy profiles, preferably made of metal. It can be fixedly or detachably connected to the rest of the basic frame. FIG. 5 opens up a view into the interior of the treatment module 100. It is also possible to see a support frame 120, which is situated partially above a work piece W that is located in the container and runs round the edge region of the container. The support frame 120 is for holding retaining devices 130 (130.1, 130.2), which in turn retain the work piece W, as well as an oscillation frame 140, which is for holding different mounting parts. The support frame is moved to and fro parallel to the arrow $P_1$. Consequently all the module components and also the work piece W are also moved synchronously with this movement. This movement is accomplished by means of a drive 125, for example a pneumatic cylinder, which is supported on the accommodating frame 110. The support frame is moved via rails 127, which are precisely positioned by means of adjusting devices 128, on a defined path. Pneumatic cylinders for the drive 125 are small and, compared with a motor drive, insensitive to vapours, which typically prevail in a plating container between the bath surface and the cover, and to fluids. In addition, they are cost-effective. Over and above this, they enable defined end positions of the driven support frame 120.

As the support frame 120 also holds the oscillation frame 140, this is also moved to and fro like the support frame 120 parallel to the arrow $P_1$. In addition, the oscillation frame 140 is moved to and fro via another drive 145 in one direction, which extends at right angles to the direction of movement $P_1$ of the support frame 120. This movement direction is indicated by the additional arrow $P_2$.

The drives 125 and 145 for the support frame 120 or respectively the oscillation frame 140 are pneumatically or electromotively operated.

In the interior of the container there is a work piece W, for example a printed circuit board. This work piece W is retained in vertical orientation in the container by means of retaining devices 130 (130.1, 130.2). The retaining devices 130 grip the work piece W in its respective end regions. FIG. 5 shows two retaining devices 130, namely a first retaining device 130.1, which grips the work piece W at the left edge, and a second retaining device 130.2, which grips the work piece W at the right edge. The retaining devices 130 are also retained, as the work piece W, in vertical orientation in the container. The retaining devices 130 each comprise two clamping finger groups 135, which rest on one edge side each when the work piece W is being clamped. The clamping finger groups 135 are each pivotable about a pivot point. Consequently, they can be pivoted into a release position and into a clamping position. For this purpose there are drives 137, which actuate one clamping finger group each. These drives 137 are also pneumatically operated, opened and closed under the effect of pneumatic force or, alternatively, opened under the effect of pneumatic force, whereas in this case a closing force is applied by means of a pre-biased spring. This means that the closing force can still be maintained if there is a power failure.

The retaining devices 130 are retained by the support frame 120. This means that the retaining devices 130, consequently also the clamping finger groups 135 and after all the work piece W, through the movement to and fro of the support frame are retained in constant movement parallel to the arrow direction $P_1$.

In addition, on both sides of the work piece W in the container there are flow devices 150, which are retained by the oscillation frame 140. As the oscillation frame 140 is moved in constant movement both in arrow direction $P_1$ and also in arrow direction $P_2$, these flow devices 150 are also moved constantly in these directions. As the deflection of the movement in arrow direction $P_1$ corresponds to that of the support frame 120 and consequently of the work piece W, the spacing between the work piece W and the flow devices 150 always remains constant. In addition, a relative movement occurs between the flow devices 150 and the work piece W parallel to its surface, such that a uniform impingement of the two work piece surfaces can be obtained.

Outside the container are attachment parts, namely units such as filters 600 and additional units such as pumps 700 and connections for auxiliary media 500, such as compressed air, water etc. These are secured to the basic frame at a common location. They are situated preferably at the location on the basic frame where the module borders onto a maintenance corridor. These connections have easily detachable connections for the units using the media.

Not shown are possible covers which cover the treatment module during the treatment or also cover them when they do not contain a work piece. For covering the treatment module there is a cover that opens automatically on the accommodating frame, the said cover preferably being in the form of a sliding cover and preferably being driven pneumatically. Particles falling down are kept out of the bath in this way, and the air volume to be sucked out is reduced.

Figure 6:
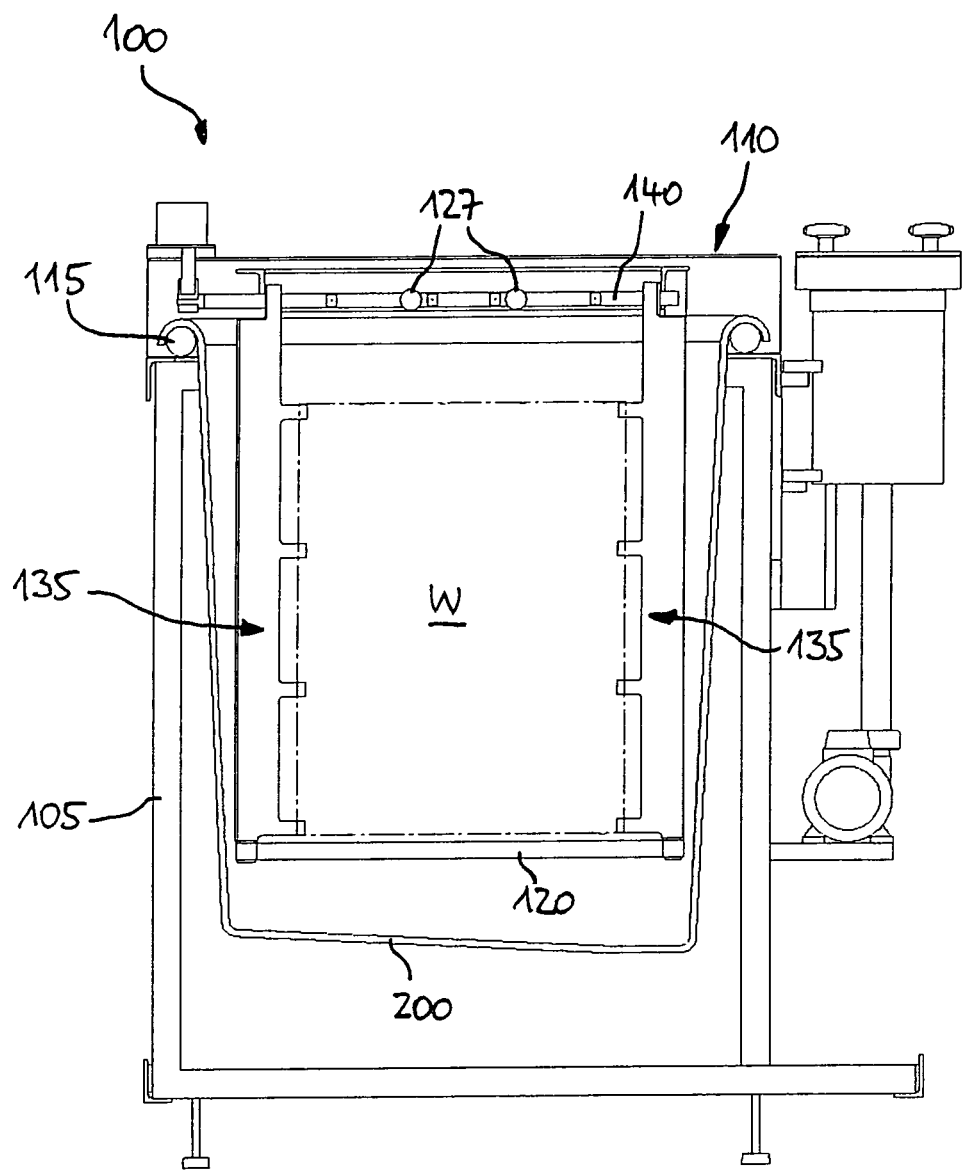
FIG. 6: is a schematic side view in section of the treatment module in FIG. 5.

FIG. 6 is a schematic representation in section of a side view of a treatment module 100. The treatment module 100 includes a basic frame 105. A part of the basic frame 105 is the accommodating frame 110, which is situated in the upper region of the module 100 for holding, for example, the container 200. To this end, an accommodating profile 115 is provided on the accommodating frame 110, the said accommodating profile engaging in the flanged border of the container 200. The container 200 consequently hangs in the accommodating frame 110.

In addition, the support frame 120 is secured to the accommodating frame 110 via the guide with the rails 127. Consequently, the thermal expansions of the container 200 cannot affect the positioning of the support frame 120 or consequently other components of the module 100. Retaining devices are secured to the support frame, in this case represented by the clamping finger groups 135. In addition, also shown is the oscillation frame 140, which moves to and fro parallel to the drawing plane. A work piece W, for example, a printed circuit board, is gripped by the clamping finger groups 135 at the side at its edges.

Figure 7:
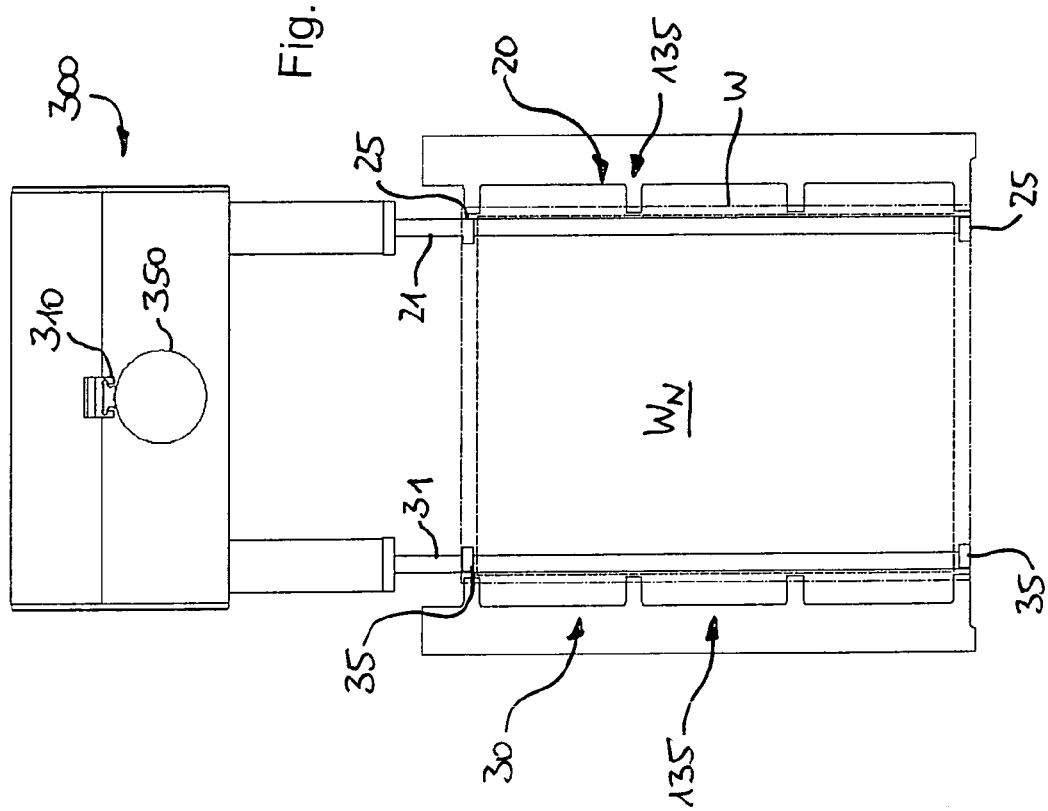
FIG. 7: is a schematic side view of a part of the transport device for the gripping device when depositing or picking up a work piece W.

FIG. 7 is a schematic representation of the transport device in more detail during the depositing or picking up of a work piece W in or respectively from the treatment module. The treatment module is not shown.

In the lower region of FIG. 7 it is shown that the work piece W, with its outer boundary represented by full lines and by an inner function region $W_N$, which is separated from a circumferential outer edge, shown by dashed lines, is retained momentarily at the same time by the clamping finger groups 135 and the clamping devices 25, 35 of the gripping devices. Whereas the clamping finger groups 135 grip the work piece W exclusively in the side edge region in a clamping manner so as not to impair a treatment, the clamping devices 25, 35 of the gripping devices can also contact the work piece W at the top and bottom edge so as to transport it.

The clamping devices 25, 35 are retained by a transport head 300, which is moveable above the treatment modules. The transport head 300 supports the fastening devices 20, 30 of the gripping device and its drive for the operation (the rotation) of the gripping device. For example, the torsion bars 21, 31 of the fastening devices 20, 30 can be driven in the most varied manner, namely by means of gear wheel systems, lever systems, spring mechanisms, motors or pneumatic drives. The drive mechanism is to be developed such that the work piece W, with the fastening devices 20, 30 in the closed state, is retained with the help of a spring mechanism. To release the work piece W, the opening drive, which works in opposition to the spring force, is activated.

The transport head 300 includes in its upper central part a dovetail guide 310, which is retained by a cross-beam 350. The cross-beam 350 extends transversely over a row of adjacently disposed treatment modules, such that the transport head 300 is moveable over this entire row of treatment modules. This means that the transport head 300 can lower the fastening devices 20, 30 into each treatment module in such a row. If several of these types of rows of treatment modules are set up in a matrix-like manner one behind the other, the transport head 300 can also be moved, in addition, in a direction at right angles to the direction of the cross beam 350. The transport device includes a transport cart (not shown) for this purpose.

Figure 8:
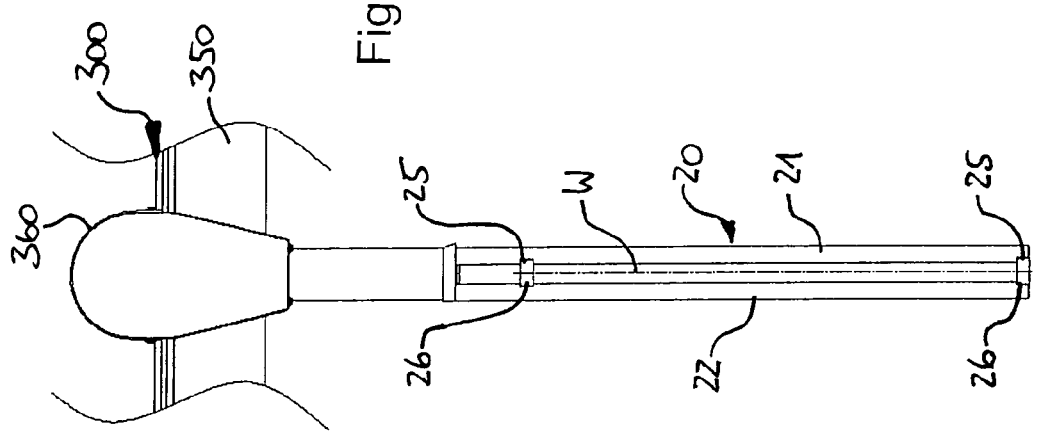
FIG. 8: is a schematic side view of the transport device in FIG. 7 with an aerodynamic housing.

FIG. 8 shows the transport head 300 with fastening devices 20 secured thereto and torsion bars 21, 22 secured thereto with clamping devices 25, 26 and an aerodynamic housing 360 that surrounds the transport head 300. This housing surrounds the transport head 300 totally and enables filtered air to flow around the product W from above in a uniform manner, which means that there is no risk that air turbulence will form, which would lead to contamination. A laminar air flow is not impaired by the drop shape of the housing 360.

Figure 9:
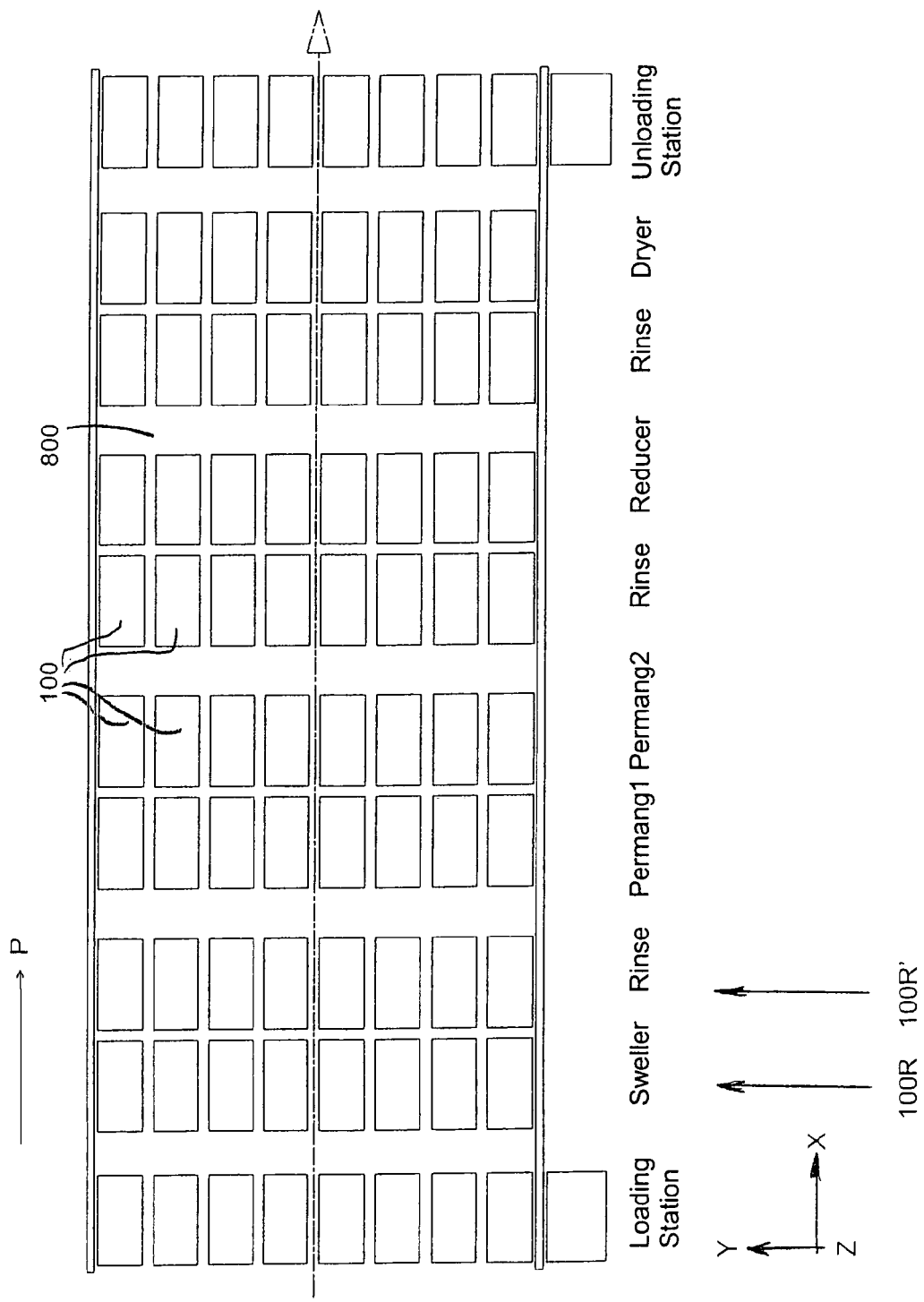
FIG. 9: is a schematic representation of the arrangement of treatment modules in a first specific embodiment.

FIG. 9 is a schematic representation of the arrangement of treatment modules in a first specific embodiment. This arrangement relates to the treatment of printed circuit boards for cleaning the bore holes, the treatment sequence being: loading, swelling, rinsing, permanganate treatment, rinsing, reducing, rinsing, drying and unloading.

The individual treatment modules, from a bird's eye view, are shown in the form of individual boxes. One single printed circuit board can be accommodated in each of these modules. The modules are arranged such that they are disposed adjacent each other with their narrow end faces. The printed circuit boards are thereby introduced into the module parallel to a main transport direction (arrow P at the top of the representation). This means that many circuit boards can be treated at the same time, and the transport device, which is used for this purpose and extends over a row 100R of these types of modules (not shown), can be relatively narrow.

The individual module rows 100R, 100R', in addition, are disposed such that every two module rows are disposed closely adjacent to each other. Between two adjacent module rows 100R, 100R' is a maintenance corridor 800. In addition, at the sides of the modules facing the maintenance corridor 800 attachment parts (not shown) can be disposed, which are easily accessible for maintenance.

In this specific embodiment, in one module row there are modules arranged that serve the same treatment step. Consequently, the circuit boards are lowered parallel into the individual rows 100R, treated there and are then each lowered into a module in the adjacent module row 100R'.

The printed circuit boards are moved first into the individual modules of the loading station by a device that is not shown here. From there, the circuit boards are then conducted by means of the transport device from one row 100R of treatment modules to the next row 100R'. After the circuit boards have been transferred into the modules of the unloading station, the finished circuit boards are removed from the system by means of a device that is not shown here.

Figure 10:
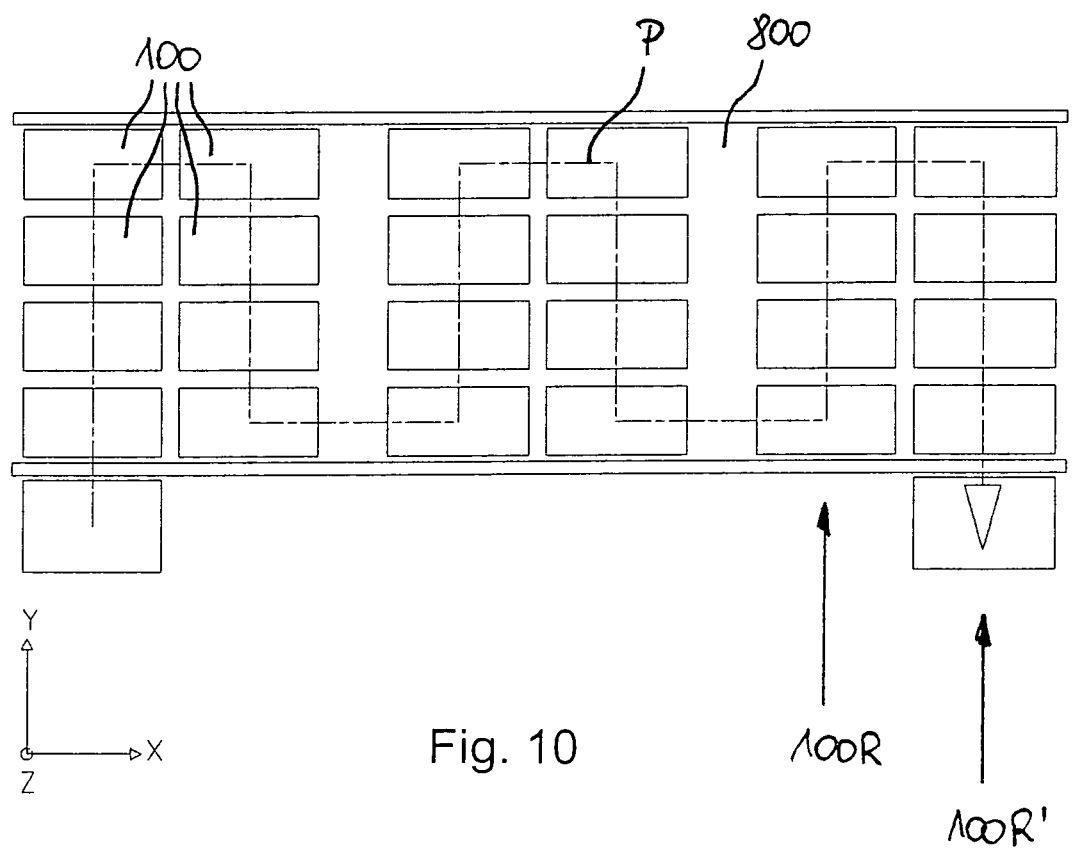
FIG. 10: is a schematic representation of the arrangement of treatment modules in a second specific embodiment.

FIG. 10 is a schematic representation of a second specific embodiment for the arrangement of treatment modules. This arrangement relates to the treatment of circuit boards for the bore hole cleaning: loading, swelling, rinsing, permanganate treatment, rinsing, reducing, rinsing, electroless coppering, rinsing, drying, unloading.

As in the case represented in FIG. 9, only one circuit board is lowered into each treatment module. However, the modules in this second specific embodiment are not arranged repeatedly in rows 100R, 100R' at right angles to a main transport direction P. Only one respective specimen is provided for the modules for a specific treatment step which means that one circuit board after another is conveyed through the vertical system. From the arrangement of the individual treatment modules it can be seen that the boards are each conveyed through the system in a meander-shaped manner.

In this arrangement also every two rows 100R, 100R' of modules are closely adjacent such that maintenance corridors 800 are produced between two such rows.

FIG. 11 shows a variant of FIG. 9, where the treatment modules are disposed in rows 100R, 100R' transversely relative to the main transport direction P and form in the individual rows in each case series 100F, 100F' of treatment modules.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

The invention claimed is:

1. Vertical system for the plating treatment of a work piece (W), the said system comprising at least two treatment modules (100), wherein retaining devices (130) for the work pieces (W) are provided in the treatment modules (100), and at least one transport device adapted to convey at least one work piece (W) to a treatment module (100) and to transfer the work piece (W) to the retaining devices (130) in the treatment module (100), wherein the transport device comprises at least one gripping device (10), which retains the work piece (W) and has at least one respective fastening device (20, 30), and each fastening device (20, 30) comprises first clamping devices (25, 35) and second clamping devices (26), each of which are associated with one side of the work piece (W), wherein both the first clamping devices (25, 35) and the second clamping devices (26) are displaceable for gripping and releasing the work pieces (W), wherein the at least one gripping device (10) comprises at least two fastening devices (20, 30) that are spaced apart from one another, each of the first clamping devices (25, 35) and second clamping devices (26) of which are moveable by torsion bars (21, 31, 22) as a result of which the work piece (W) is tensioned between the fastening devices (20, 30) during clamping parallel to its first side.

2. Vertical system according to claim 1, characterised in that the first clamping device (25, 35), associated with a first side of the work piece (W), is designed and disposed such that the position of the first side of the work piece (W) is defined by the first clamping device (25, 35), and in that the second clamping device (26), associated with a second side of the work piece (W), is designed and disposed such that a clamping force can be exerted onto the work piece (W) by the said second clamping device.

3. Vertical system according to claim 1, characterised in that the first clamping device (25, 35) of a fastening device (20, 30) is rotatable about a first axis of rotation (201) and the second clamping device (26) of the fastening device (20, 30) is rotatable about a second axis of rotation (202) that is parallel to the first axis of rotation.

4. Vertical system according to claim 3, characterised in that the position of the first side of the work piece (W) is defined by a rotational position of the first clamping device (25, 35).

5. Vertical system according to claim 3, characterised in that a first portion of the outer boundary of a section of the first clamping device (25, 35) generated at right angles to the first axis of rotation (201) is curved convexly and in that a second portion of the outer boundary of the section is formed by a straight boundary line that connects in a tangential manner to the first portion of the outer boundary.

6. Vertical system according to claim 5, characterised in that the first portion is formed by a convex surface segment (28) parallel to the first axis of rotation (201) and in that the second portion is formed by a contact face (27) abutting against the first side of the work piece (W).

7. Vertical system according to claim 1, characterised in that the second clamping device (26) comprises a convex clamping face (29) that is designed to transfer a clamping force to the second side of the work piece (W).

8. Vertical system according to claim 3, characterised in that the first torsion bar (21, 31) retains the first clamping device (25, 35) and is coaxial relative to the first axis of rotation (201), and the second torsion bar (22) retains the second clamping device and is coaxial relative to the second axis of rotation (202).

9. Vertical system according to claim 8, characterised in that at least two pairs of clamping devices, each comprising a first clamping device (25, 35) and a second clamping device (26), are retained on a torsion bar pair of a fastening device (20, 30), the said torsion bar pair comprising the first torsion bar (21, 31) and the second torsion bar (22).

10. Vertical system according to claim 1, characterised in that the gripping device is designed in a manner that is favourable for the incident flow of filtered air.

11. Vertical system according to claim 1, characterised in that the retaining device (130) is designed such that the position of the work piece (W) that is retained by the retaining device is adjustable in the treatment module (100).

12. Vertical system according to claim 1, characterised in that at least one treatment module (100) has the following structural features:
   a. a container (200) for accommodating treatment fluid;
   b. a basic frame (105) with an accommodating frame (110) supporting the container (200);
   c. mounting parts;
   d. a support frame (120) for mounting parts that are to be moved at right angles to the work piece plane;
   e. an oscillation frame (140) for mounting parts that are to be moved parallel to the work piece plane;
   f. attachment parts; and
   g. covers for the container (200).

13. Vertical system according to claim 12, characterised in that the support frame (120) is retained by the accommodating frame (110) so as to be moveable.

14. Vertical system according to claim 13, characterised in that the container (200) does not assume any static tasks.

15. Vertical system according to claim 12, characterised in that the support frame (120) is moveable by means of at least one pneumatic drive (125).

16. Vertical system according to claim 12, characterised in that the support frame (120) is adjustable in at least one direction.

17. Vertical system according to claim 12, characterised in that the oscillation frame (140) is retained on the support frame (120) so as to be moveable.

18. Vertical system according to claim 12, characterised in that mounting parts that are to be moved parallel to the work piece (W) are retained by the oscillation frame (140).

19. Vertical system according to claim 1, characterised in that at least one treatment module (100) is designed such that it is possible to treat just one single work piece (W) therein.

20. Vertical system according to claim 1, characterised in that a plurality of treatment modules (100) are disposed in a matrix-like manner in series and rows of treatment modules (100).

21. Vertical system according to claim 20, characterised in that the treatment modules (100) have an elongated basic outline with oppositely situated longitudinal sides and are disposed such that the respective longitudinal sides extend in the transport direction for the work pieces (W).

22. Vertical system according to claim 20, characterised in that the treatment modules (100) have an elongated basic outline with oppositely situated end faces and every two treatment modules (100) are disposed adjoining each other by means of the end faces.

23. Vertical system according to claim 20, characterised in that at least one transport device is designed such that the work piece (W) can be conveyed from one treatment module (100) to any other treatment module (100).

24. Vertical system according to claim 1, characterised in that each of the treatment modules (100) is equipped for a self-sufficient operation.

25. Method according to claim 22, characterised in that the position of the contact side of the work piece (W) is transferred by the gripping device (10) precisely to the retaining device (130) and is taken over by the said retaining device.

26. Vertical system according to claim 1, characterised in that the first clamping device (25, 35) of the fastening device (20, 30) is rotatable about a first axis of rotation (201) and the second clamping device (26) of the fastening device (20, 30) is rotatable about a second axis of rotation (202) that is parallel to the first axis of rotation.

27. Vertical system according to claim 26, characterised in that the position of the first side of the work piece (W) is defined by a rotational position of the first clamping device (25, 35).

28. Vertical system according to claim 1, characterised in that the second clamping device (26) comprises a convex clamping face (29) that is designed to transfer a clamping force to the second side of the work piece (W).

29. Vertical system according to claim 28, characterised in that the first torsion bar (21, 31) retains the first clamping device (25, 35) and is coaxial relative to the first axis of rotation (201), and the second torsion bar (22) retains the second clamping device and is coaxial relative to the second axis of rotation (202).

30. Vertical system according to claim 7, characterised in that the first torsion bar (21, 31) retains the first clamping device (25, 35) and is coaxial relative to the first axis of rotation (201), and the second torsion bar (22) retains the second clamping device and is coaxial relative to the second axis of rotation (202).

31. Method for conveying a work piece (W), retained in vertical orientation by means of a gripping device (10), to a treatment module (100), wherein each gripping device (10) comprises at least one fastening device (20, 30), on which fastening device (20, 30) first clamping devices (25, 35), each of which are associated with one side of the work piece (W), and second clamping devices (26) are provided, wherein the first clamping devices (25, 35) and the second clamping devices (26) are moveable for gripping and releasing the work pieces (W) and wherein the method for gripping the work piece (W) comprises the following method steps:
   a. conveying the work piece (W) to the treatment module (100);
   b. gripping the work piece (W) with a retaining device (130) disposed in the treatment module (100); and
   c. releasing the work piece (W) by the gripping device (10), wherein the gripping device (10) comprises at least two fastening devices (20, 30) that are spaced apart, the respective first clamping device (25, 35) and respective second clamping device (26) of which clamp the work piece (W) in position at oppositely situated edges and during the clamping action exert tension forces directed against each other onto the work piece (W) as a result of which a tension force is applied to the work piece (W) by torsion bars (21, 31, 22) between the fastening devices (20, 30) during clamping parallel to its first side.

32. Method according to claim 31, characterised in that the method comprises the following further method steps for actuating the gripping device (10):
  i. moving the first clamping device (25, 35) such that the first clamping device (25, 35) takes over a contact position and thereby defines the position of the first side of the work piece (W); and
  ii. moving the second clamping device (26) such that the second clamping device (26) takes over a clamping position and thereby the work piece (W) is clamped in position together with the at least one first clamping device (25, 35),
  wherein the first clamping device (25, 35) takes over the contact position before the second clamping device (26) takes over the clamping position.

33. Method according to claim 32, characterised in that after carrying out method step ii., the method includes the following further method step:
  iii. moving the first clamping device (25, 35) and the second clamping device (26) synchronously such that a tension force is exerted parallel to the first side of the work piece (W) onto the work piece.

34. Method according to claim 31, characterised in that the movements of the first clamping device (25, 35) and of the second clamping device (26) are rotary movements.

35. Method according to claim 34, characterised in that the first clamping device (25, 35) comprises a planar surface portion (27) and in method step i. is rotated until the planar surface portion (27) has reached the contact position.

36. Method according to claim 31, characterised in that after the treatment of a work piece (W), the gripping device (10) is moved into the treatment module (100) to grip the work piece (W) there, and in that, once the work piece (W) has been gripped, the gripping device (10) is moved out of the treatment module (100).

37. Method according to claim 31, characterised in that the gripping device (10) deposits the work piece (W) in a treatment module (100), releases it and is then moved out of the treatment module (100).

38. Method according to claim 31, characterised in that after carrying out method step ii., the method includes the following further method step:
  iii. moving the first clamping device (25, 35) and the second clamping device (26) synchronously such that the tension force is exerted parallel to the first side of the work piece (W) onto the work piece.

39. Method according to claim 38, characterised in that the movements of the first clamping device (25, 35) and of the second clamping device (26) are rotary movements.

40. Method according to claim 33, characterised in that the movements of the first clamping device (25, 35) and of the second clamping device (26) are rotary movements.

* * * * *